United States Patent
Lee et al.

(10) Patent No.: US 7,564,312 B2
(45) Date of Patent: Jul. 21, 2009

(54) RESONANT AMPLIFIER

(75) Inventors: Ching-Feng Lee, Hsinchu (TW); Tzu-Yi Yang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 79 days.

(21) Appl. No.: 11/344,071

(22) Filed: Feb. 1, 2006

(65) Prior Publication Data
US 2007/0115063 A1    May 24, 2007

(30) Foreign Application Priority Data
Nov. 18, 2005   (TW) .................. 94140686 A

(51) Int. Cl.
*H03F 3/191* (2006.01)
(52) U.S. Cl. .......................... 330/302; 330/45
(58) Field of Classification Search ......... 330/301–302, 330/310–311, 285–286, 296
See application file for complete search history.

(56) References Cited

U.S. PATENT DOCUMENTS

| 4,769,714 A | 9/1988 | Osborne |
| 5,945,879 A | 8/1999 | Rodwell et al. |
| 6,133,793 A * | 10/2000 | Lau et al. ................. 330/302 |

FOREIGN PATENT DOCUMENTS

TW    578368    3/2004

OTHER PUBLICATIONS

Choong-Yul Cha, et al., "A 5.2-GHz LNA in 0.35-μm CMOS Utilizing Inter-Stage Series Resonance and Optimizing the Substrate Resistance." IEEE Journal of Solid-State Circuits, vol. 38, No. 4, Apr. 2003.
Taiwanese Patent Office Action and Search Report dated May 13, 2008 and partial English language translation thereof.
Taiwanese Patent Office Action and Search Report dated Sep. 26, 2008 and partial English language translation thereof.

* cited by examiner

*Primary Examiner*—Robert Pascal
*Assistant Examiner*—Hieu P Nguyen
(74) *Attorney, Agent, or Firm*—Harness, Dickey & Pierce, P.L.C.

(57) ABSTRACT

A resonant amplifier is provided. A resonant inductor is connected in series between a source (emitter) of a common gate (base) transistor and an input point (i.e. output point of previous stage), and a resonant capacitor is connected between the input point and a ground or a voltage source connected to a loading end, such that a lossy resonant cavity is formed for carrying out resonance to amplify the signal. Then, the amplified signal is drawn out by the common gate (base) architecture. Therefore, the gain of the resonant amplifier can be boosted at desired frequency.

14 Claims, 11 Drawing Sheets

RESONANT AMPLIFIER

CROSS-REFERENCE TO RELATED APPLICATIONS

This non-provisional application claims priority under 35 U.S.C. § 119(a) on Patent Application No. 094140686 filed in Taiwan, R.O.C. on Nov. 18, 2005, the entire contents of which are hereby incorporated by reference.

BACKGROUND

1. Field of Invention

The present invention relates to an amplifier, and more particularly to a resonant amplifier.

2. Related Art

The phenomenon of high-frequency gain roll-off is often encountered in the design of wide-band amplifiers. For the application of the 50 to 860 MHz low noise amplifier in TV tuner front-end, this problem can be overcome by using external passive elements to provide much higher high-frequency impedance so that the gain is boosted at high frequency. However, in recent years, it has become a trend in the field to provide totally integrated-circuit (IC) solutions to solve the problem of high-frequency gain falling.

Conventionally, an amplifier adopts common source architecture with a circuit as shown in FIG. 1. A resistor R1 is mainly used to generate a direct current (DC) bias. The input voltage Vi is input from the gate of a transistor M1, and then is amplified. The amplified voltage Vo is output from a drain of the transistor M1. As the transistor M1 is a metal-oxide semiconductor field-effect transistor (MOSFET), in practice, the input and output stray capacitance may limit the operating frequency range of the amplifier.

When the gain is still inadequate, the same single-stage amplifying circuit architecture can be connected in series to form a multi-stage amplifying circuit. As such, the operating frequency range of the amplifier is more limited.

Furthermore, another amplifier adopts cascode architecture, as shown in FIG. 2. The cascode amplifying circuit comprises a common source transistor M2 together with a common gate transistor M3. The major characteristic is reducing the Miller effect and improving frequency response performance. Though the signal passes through the common source and the common gate transistors, in fact, only the common source transistor provides voltage gain.

Another conventional amplifier for gain boosting employs common gate (base) architecture, as shown in FIG. 3, where the input voltage Vi is input from a gate of a transistor M4, and then is amplified. The inherent stray capacitance between the gate and the source of a transistor M5 acts as the capacitive reactance of the resonant cavity, and a resonant inductor Lr, a blocking load inductor Ld, a bulk bypass capacitor C2, and a bulk coupling capacitor C1 are added to achieve resonance. A bias resistor R2 having blocking effect is also required at the gate of the transistor M5 to form the resonant cavity. However, the reverse isolation between the output and the input will be deteriorated due to R2, so it is better to cascade a common gate (base) transistor M6 with its gate (base) grounding, as shown in FIG. 4. This architecture is disadvantageous for low-voltage operation.

In view of the above, the conventional amplifier still has room for improvement, in order to further provide simple and practical circuit architecture for solving the problem of limited gain in the conventional architecture under the original power consumption.

SUMMARY

In view of the above, the object of the invention is to provide a resonant amplifier to solve the problem of limited gain under the original power consumption disclosed in the prior art.

Therefore, to achieve the above object, the resonant amplifier disclosed in the invention includes an input point, a common gate (base) transistor, a resonant inductor, a resonant capacitor, and an output point.

Every common gate (base) transistor has a gate (base), a source (emitter), and a drain (collector). The resonant inductor is connected between the input point and the source (emitter), and the resonant capacitor is connected to the input point. Therefore, the resonant capacitor, the common gate (base) transistor, and the resonant inductor can form a resonant cavity, wherein each drain (collector) is connected to an output point to output an amplified signal.

Herein, the resonant capacitor is connected between the input point and a ground or a voltage source.

Furthermore, a correction capacitor can be connected in parallel with the resonant inductor to improve an effective inductance value and an additional high-frequency zero is provided to effectively suppress high-frequency sidebands.

The features and practice of the preferred embodiments of the present invention will be illustrated in detail below with the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION

The content of the invention is illustrated in detail by embodiments accompanied by drawings. Like symbols in the specification are used to indicate like symbols appearing in the figures.

Herein, a resonant inductor is connected in series between a source (emitter) of a common gate (base) transistor and an output point of a previous stage, and a resonant capacitor is connected between the output point of the previous stage and a ground or a voltage source connected to a load end, so that a resonant cavity with loss is formed to carry out the resonance, thereby amplifying the signal. Then, the amplified signal is drawn out by the common gate (base) architecture. Therefore, the high-frequency gain roll-off of the previous stage (i.e., input stage) is compensated by the frequency response of the resonant amplifier, which is composed of the common gate (base) transistor and the resonant cavity, to accomplish the wide-band design that can be widely applied to various circuit architectures required in modern wide-band receivers, such as a digital television low noise amplifier (DTV LNA) and an ultra-wide band mixer (UWB Mixer).

Figure 5:
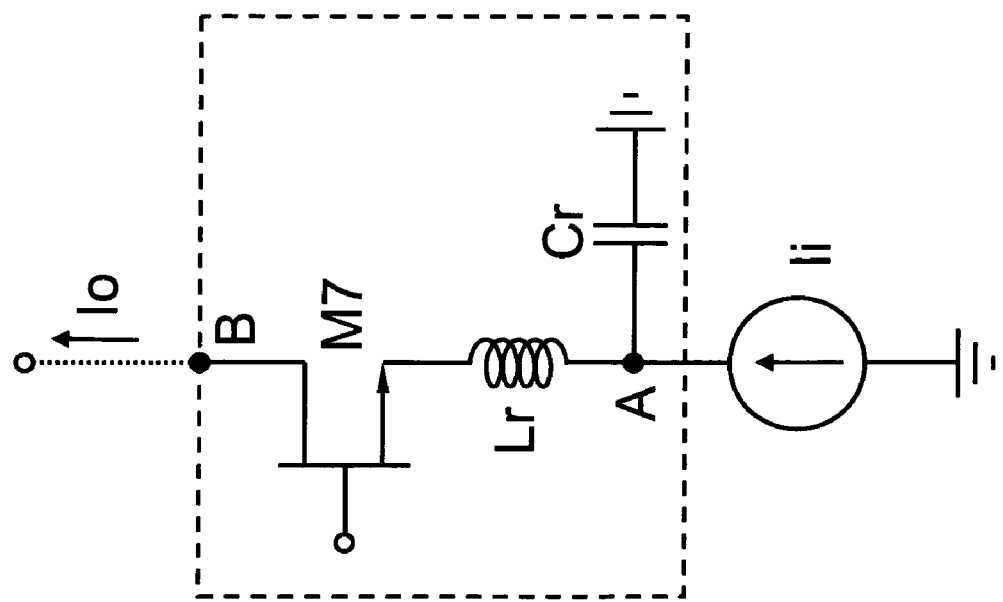
FIG. 5 is the circuit architecture of the resonant amplifier according to the first embodiment of the invention.

Referring to FIG. 5, it is an embodiment of the resonant amplifier according to the invention. Herein, an input point A is the output point of a current source Ii in the previous stage and A is connected to a resonant inductor Lr. The resonant inductor Lr is connected in series between the source of a common gate transistor M7 and the input point A. A resonant capacitor Cr is connected between the input point A and a ground. And the drain of the common gate transistor M7 is connected to an output point B for drawing out the amplified current signal.

The resonant inductor Lr, the resonant capacitor Cr, and the common gate transistor M7 can form a resonant cavity. The resonant cavity excludes extra decoupling and choke elements, and takes the transconductance of the common gate transistor M7 as the loss of the resonant cavity to obtain a current amplifying rate Q. The Q is the quality factor of the resonant cavity. The amplified current is drawn out by the common gate transistor M7, and then, the output point B outputs the amplified current Io, or voltage amplification is further carried out when a load impedance is connected to B.

Figure 2:
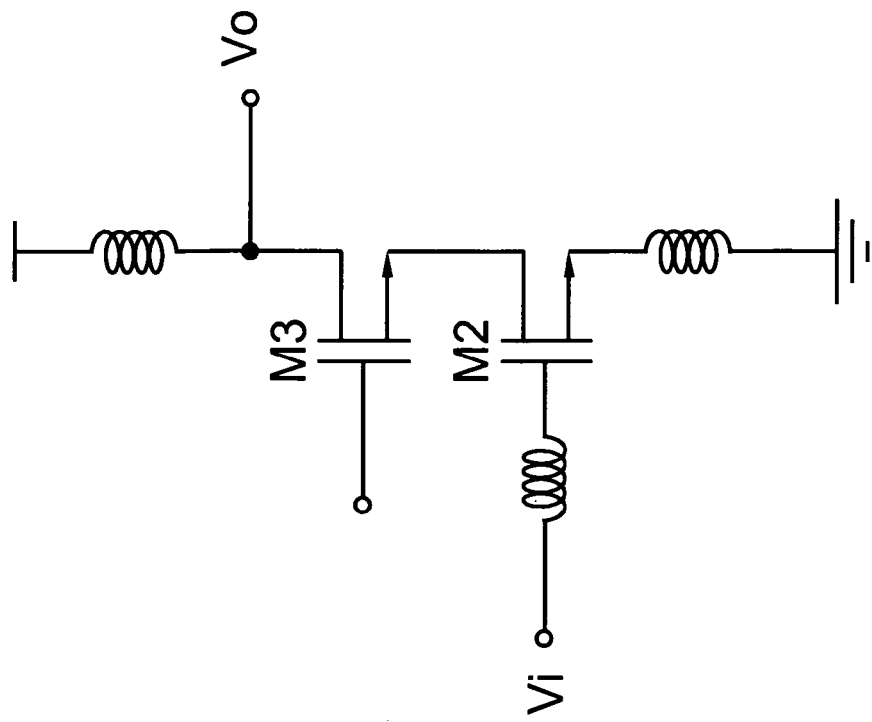
FIG. 2 is the circuit architecture of another conventional amplifier.
Figure 1:
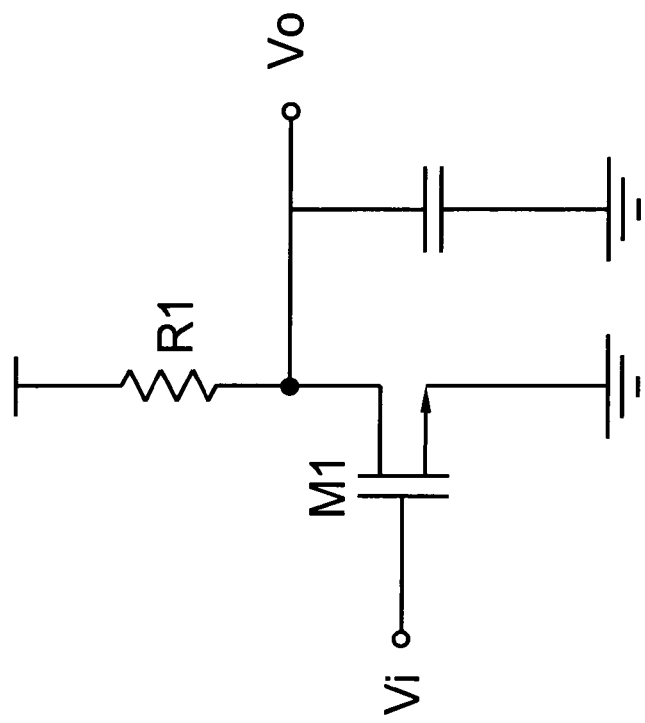
FIG. 1 is the circuit architecture of a conventional amplifier.
Figure 3:
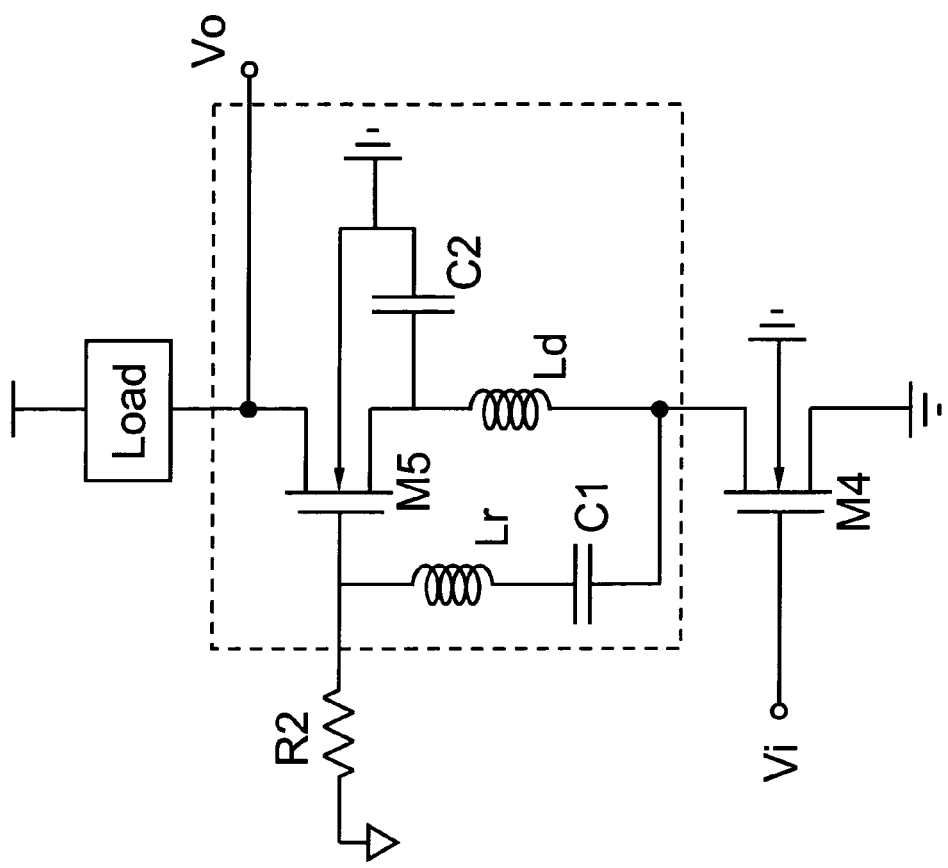
FIG. 3 is the circuit architecture of yet another conventional amplifier.
Figure 4:
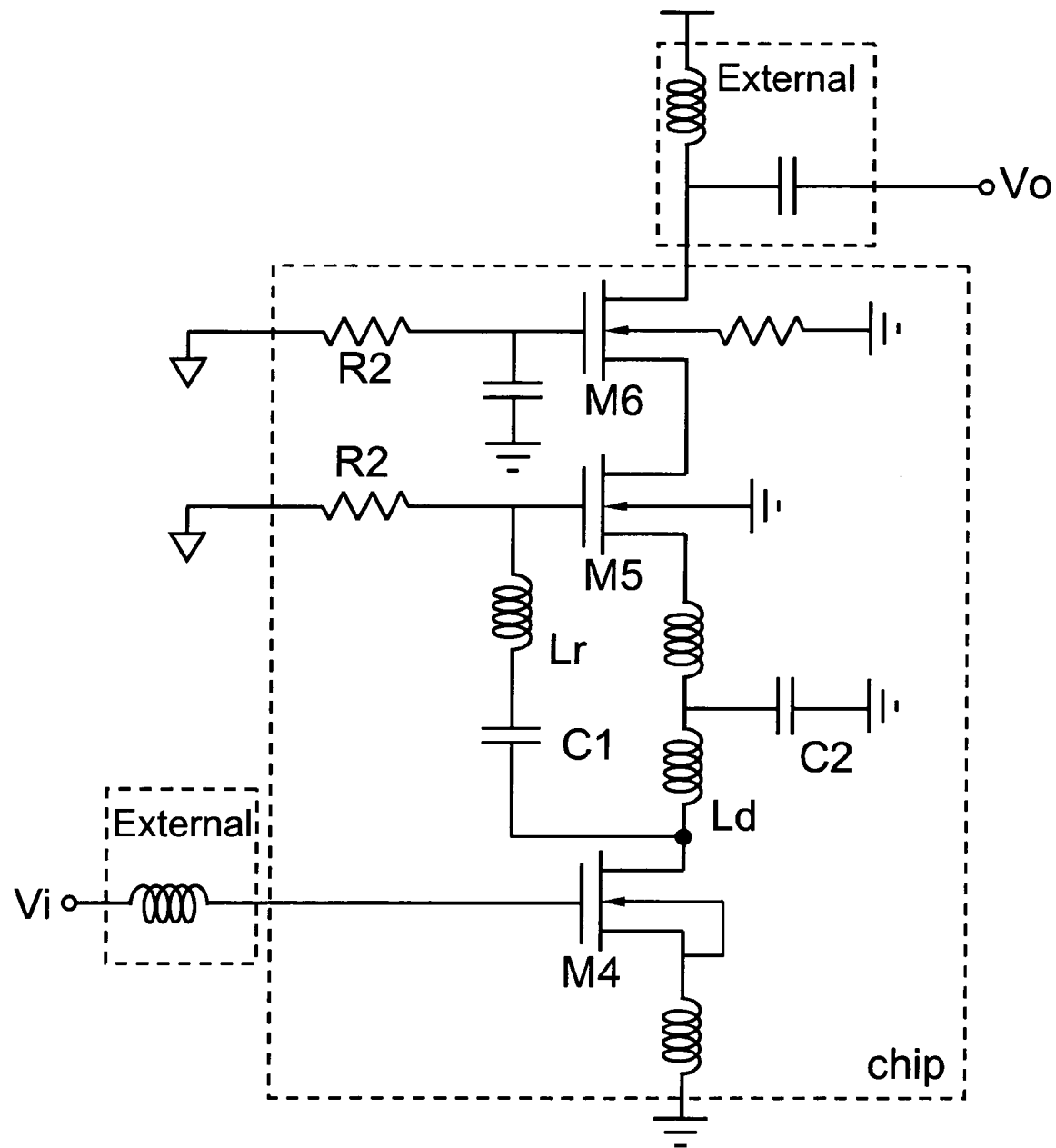
FIG. 4 is the circuit architecture of still another conventional amplifier.
Figure 6:
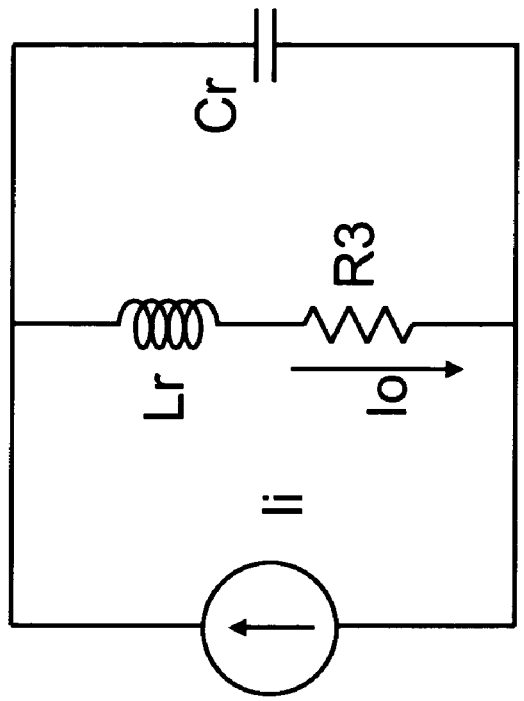
FIG. 6 is an equivalent circuit diagram of the resonant amplifier according to the invention.

In other words, referring to FIG. 6, it is an equivalent circuit diagram of the resonant amplifier according to the invention. The resistance value of the resistor R3 is the reciprocal of the conductance value (gm) of the common gate transistor, shown as follows.

$$R3 = 1/gm \qquad (1)$$

The current amplifying rate Q is the quality factor of the resonant cavity, i.e. the result of multiplying the inductance value of the resonant inductor Lr by the resonant frequency ω and then dividing it by the resistance value of the resistor R3, shown as follows.

$$Q = Lr \times \omega / R3 \qquad (2)$$

In the resonant cavity, signal energy can be stored in the LC-tank composed of the resonant inductor Lr and the resonant capacitor Cr, and the resonant frequency ω is shown as follows.

$$\omega = 1/\sqrt{(Lr \times Cr)} \qquad (3)$$

The following formula can be obtained from the formulas (1), (2), (3).

$$Q = Lr \times gm/\sqrt{(Lr \times Cr)} = gm \times \sqrt{(Lr/Cr)} \qquad (4)$$

Seen from the formula (4), a resonant cavity can be formed by the resonant inductor Lr, the resonant capacitor Cr, and the common gate transistor. The transconductance of the transistor is regarded as the loss of the resonant cavity, so that a current amplifying rate Q is obtained. The current gain is increased by adding the inductance value of the resonant inductor Lr or by reducing the capacitance value of the resonant capacitor Cr, and thereby the gain can be boosted at the desired frequency.

Furthermore, the resonant capacitor Cr can also be connected between the input point A and the external voltage source VCC. As such, a resonant cavity can also be formed by the resonant inductor Lr, the resonant capacitor Cr, and the common gate transistor M7. The transconductance of the common gate transistor M7 is regarded as the loss of the resonant cavity, so that a current amplifying rate is obtained. Then the amplified current is drawn out, as shown in FIG. 7A. The current source herein is the output of a common source transistor M8 with its gate receiving an input voltage Vi and its drain connected to the input point A. However, in practical application, it is known to those skilled in the related art that other electronic elements or any combination thereof can be used to form the current source.

Figure 7B:
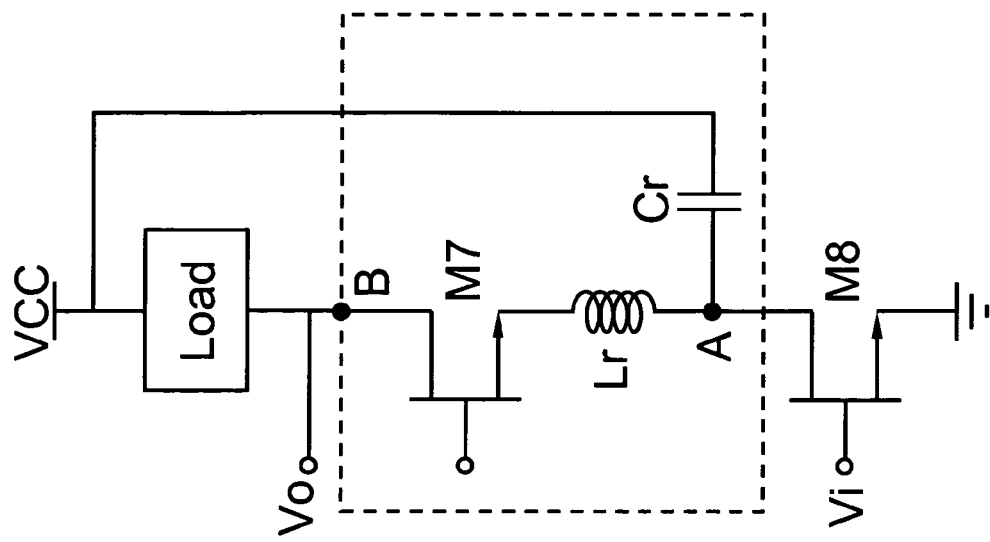
FIG. 7B is the circuit architecture of the resonant amplifier according to the third embodiment of the invention.
Figure 7A:
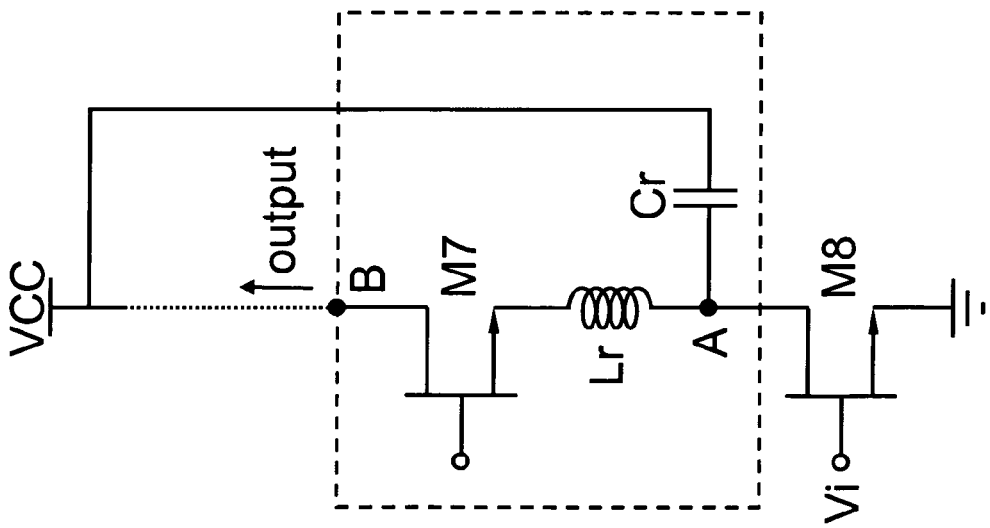
FIG. 7A is the circuit architecture of the resonant amplifier according to the second embodiment of the invention.

Besides, the external load can be connected between the output point B of the resonant amplifier and the voltage source VCC, and the amplified voltage Vo can be generated across the external load and directly output from the output point B, as shown in FIG. 7B.

Figure 8:
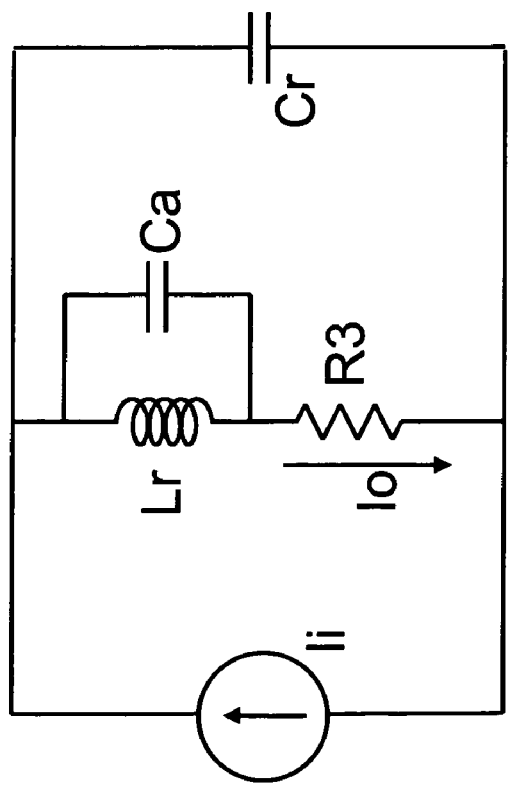
FIG. 8 is another equivalent circuit diagram of the resonant amplifier according to the invention.

Under low frequency applications, for satisfying the demand for a high inductive reactance of the resonant cavity, a correction capacitor Ca can be connected in parallel at both ends of the resonant inductor Lr, thus increasing the effective inductance, as shown in FIG. 8. The adjusted inductance (Leq) can be obtained as follows.

$$Leq = Lr/(1 - Lr \times Ca \times \omega^2)$$

Moreover, the above circuit architecture can provide a high-frequency transmission zero at a frequency $1/\sqrt{(Lr \times Ca)}$, for effectively suppressing high-frequency sidebands.

Figure 9:
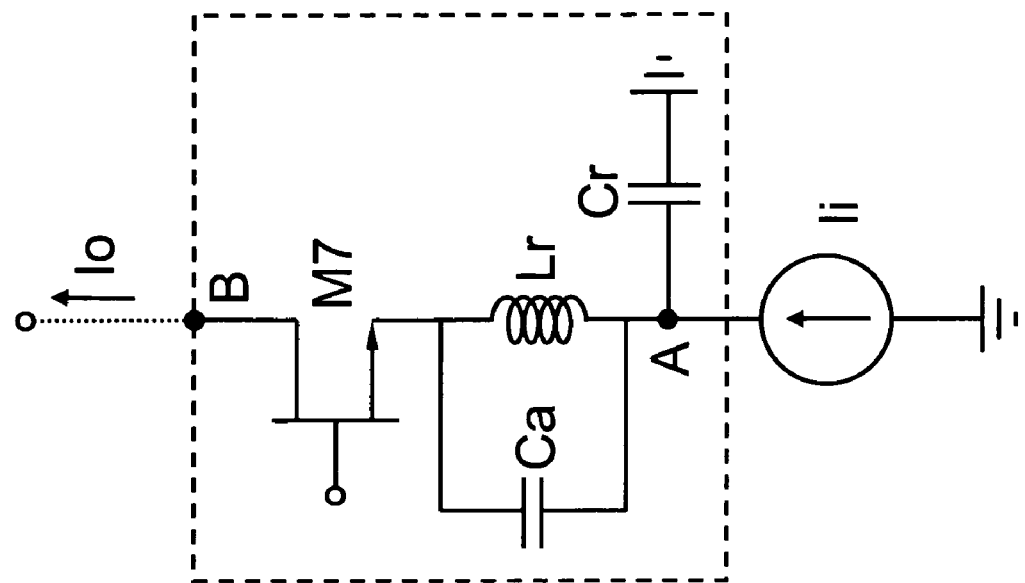
FIG. 9 is the circuit architecture of the resonant amplifier according to the fourth embodiment of the invention.
Figure 10:
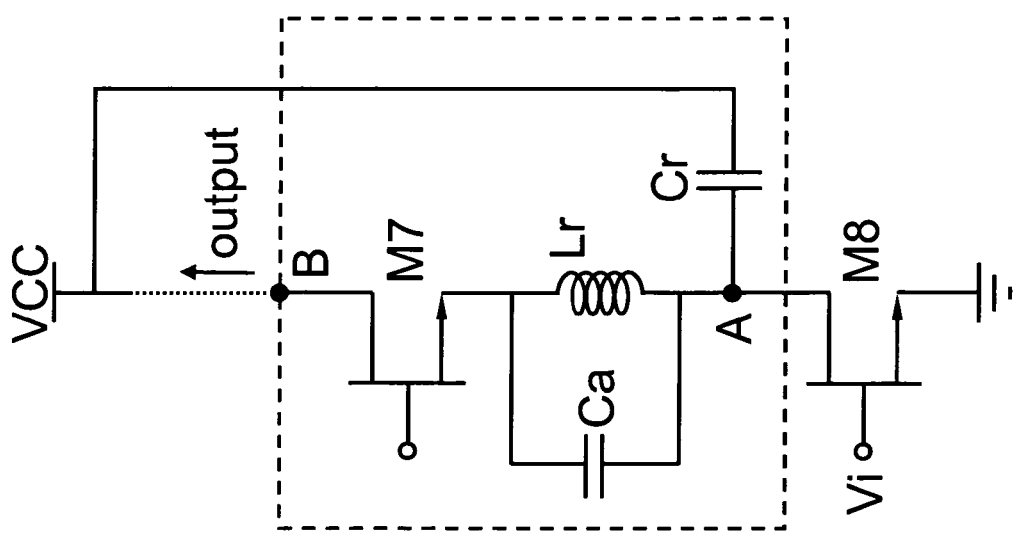
FIG. 10 is the circuit architecture of the resonant amplifier according to the fifth embodiment of the invention.

Therefore, the circuit architecture shown in FIGS. 9 and 10 is obtained, in which a correction capacitor Ca is connected in parallel at both ends of the resonant inductor Lr to enhance the effective inductance, and provide a high-frequency zero to effectively reduce the strength of high-frequency sidebands from the input A.

Figure 11A:
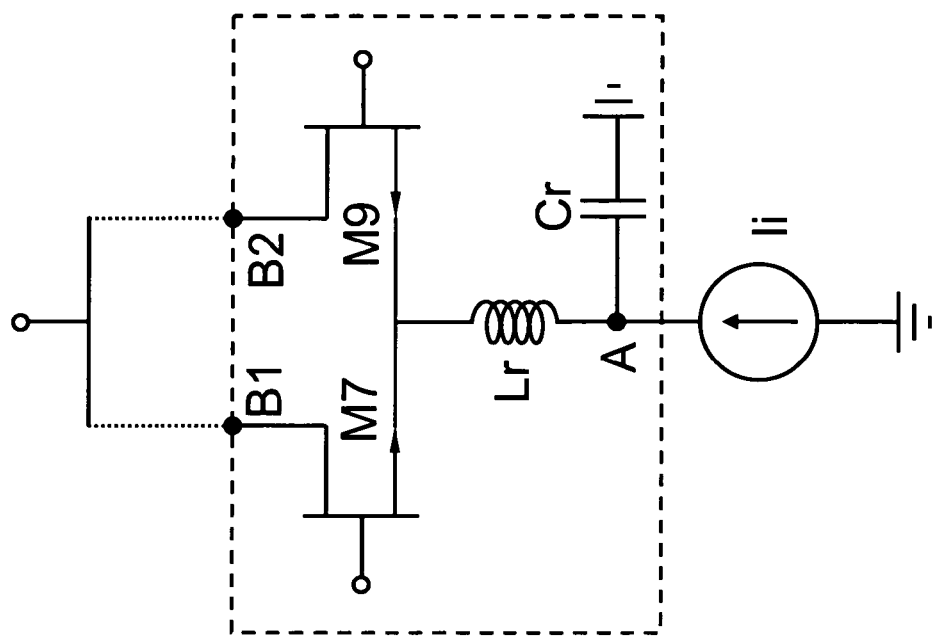
FIG. 11A is the circuit architecture of the resonant amplifier according to the sixth embodiment of the invention.

Besides, as a mixer architecture, a pair of common gate transistors M7, M9 can be adopted, wherein the sources are both connected to the resonant inductor Lr, and the drains are respectively connected to the output points B1, B2. A Local Oscillator (LO) signal is output to the gate of the common gate transistors M7, M9, so as to control one of the common gate transistors M7, M9 to form a resonant cavity together with the resonant inductor Lr and the resonant capacitor Cr, thus providing amplification while mixing the input signal from input point A with LO signal, as shown in FIGS. 11A and 12A.

Figure 11C:
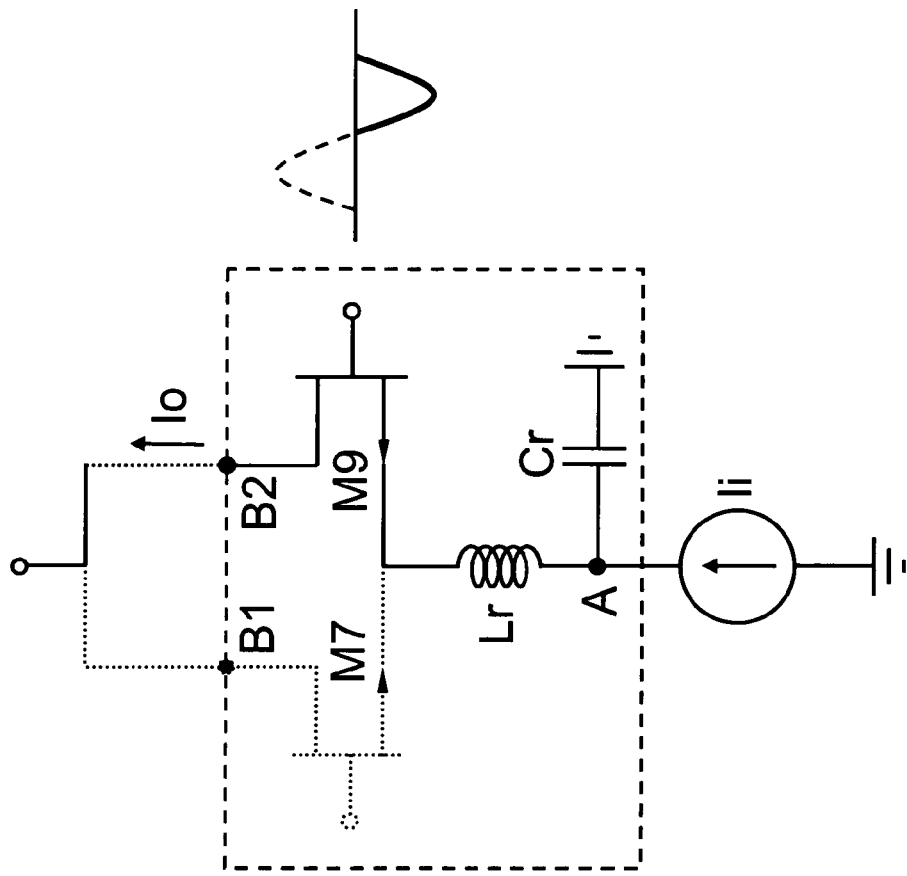
FIGS. 11B and 11C depict the operating state of the resonant amplifier of FIG. 11A.
Figure 11B:
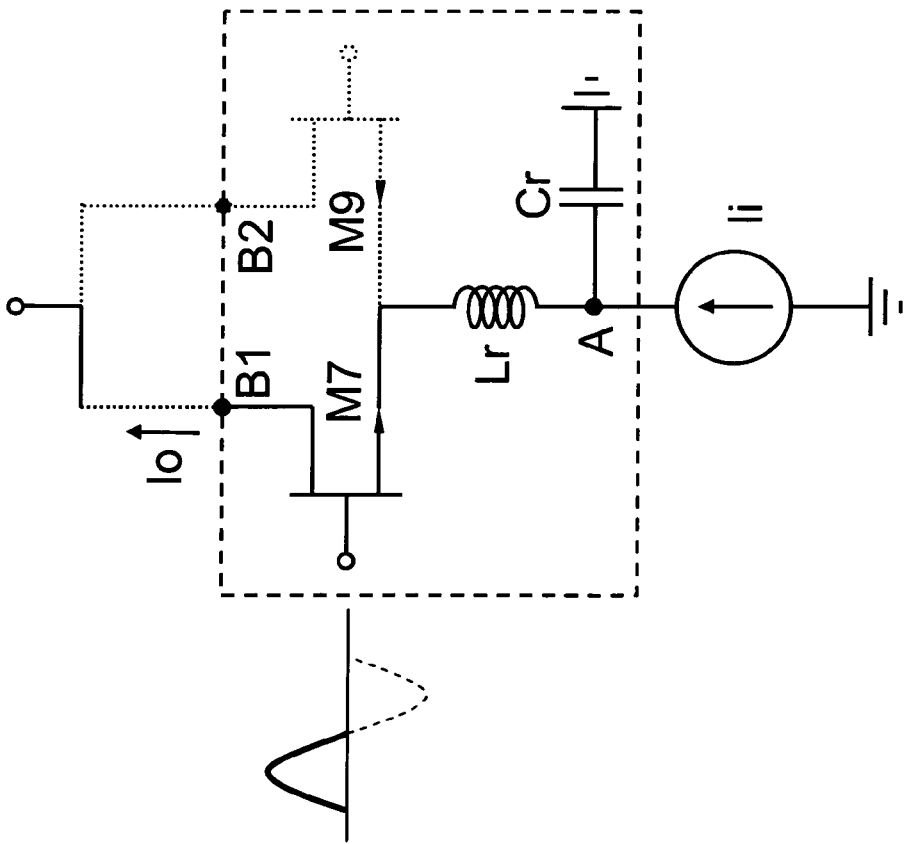
Figure 12B:
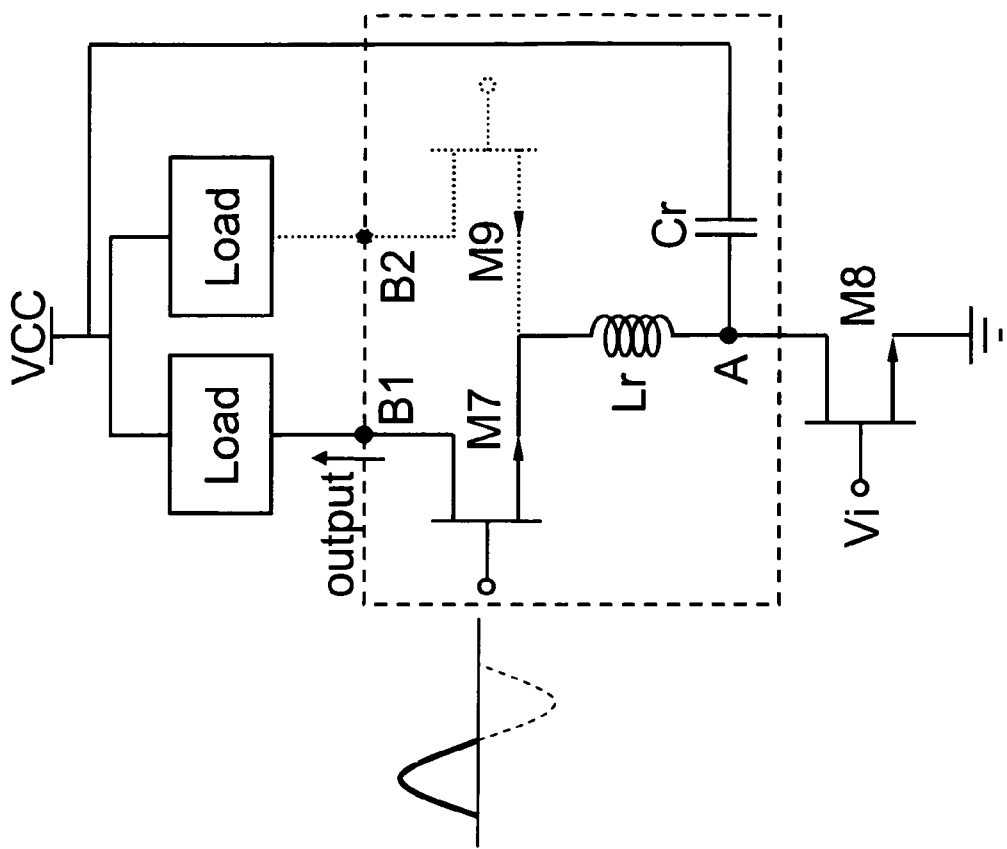
FIGS. 12B and 12C depict the operating states of the resonant amplifier of FIG. 12A.
Figure 12A:
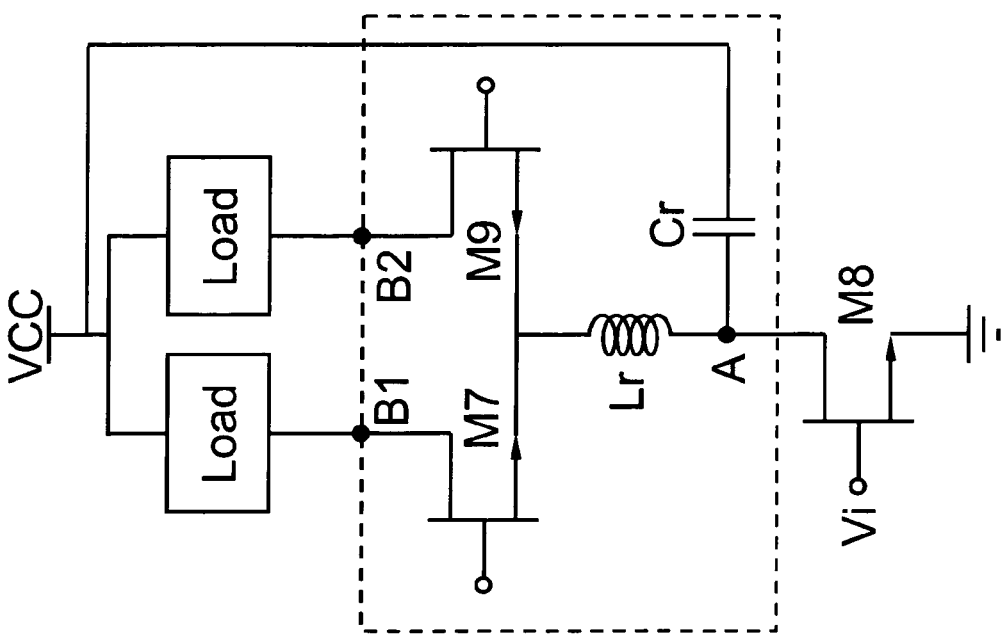
FIG. 12A is the circuit architecture of the resonant amplifier according to the seventh embodiment of the invention.
Figure 12C:
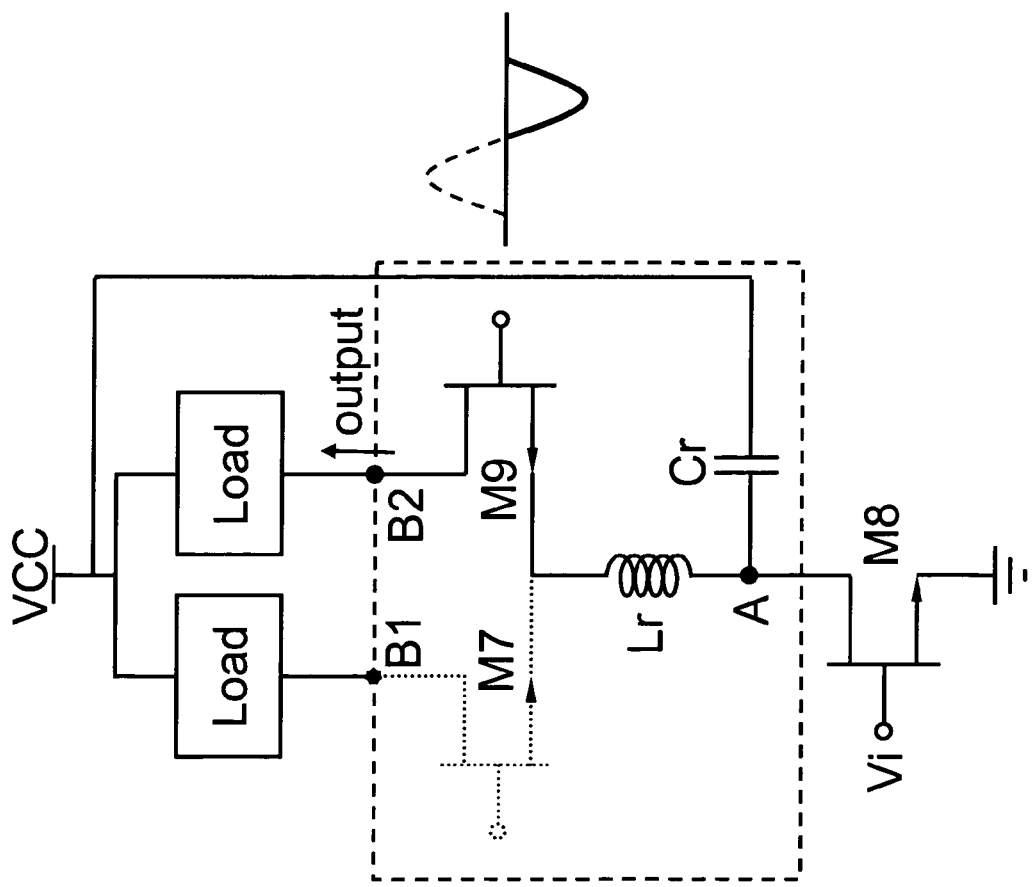

For example, when a sine signal is output to the gate of the two common gate transistors M7, M9, during the positive period, the common gate transistor M9 is off, while the common gate transistor M7 is on to form a resonant cavity together with the resonant inductor Lr and the resonant capacitor Cr for amplifying the signal, as shown in FIGS. 11B and 12B. Similarly, during the negative period, the common gate transistor M7 is off, while the common gate transistor M9 is on to form a resonant cavity together with the resonant inductor Lr and the resonant capacitor Cr for amplifying the signal, as shown in FIGS. 11C and 12C.

Figure 13:
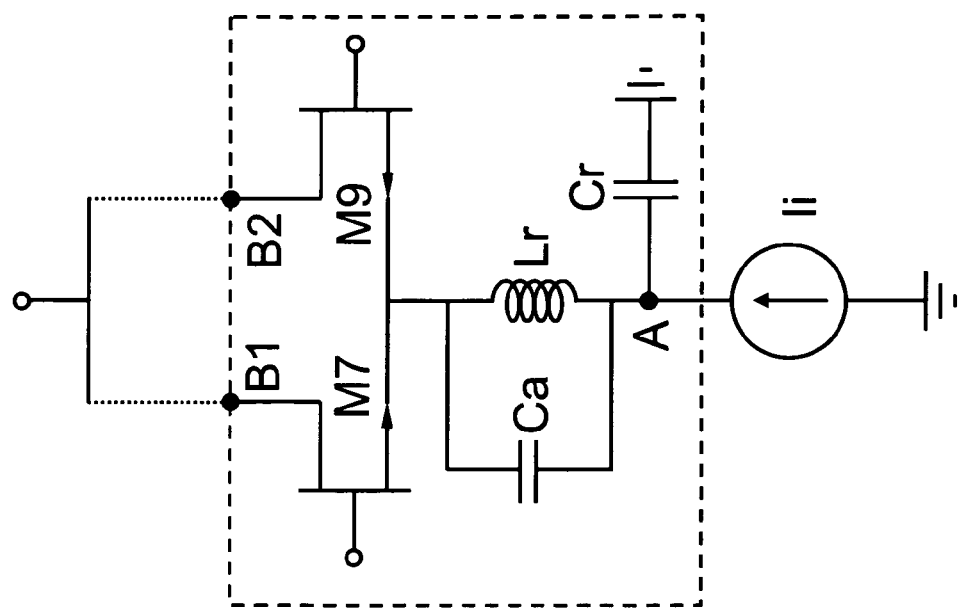
FIG. 13 is the circuit architecture of the resonant amplifier according to the eighth embodiment of the invention.
Figure 14:
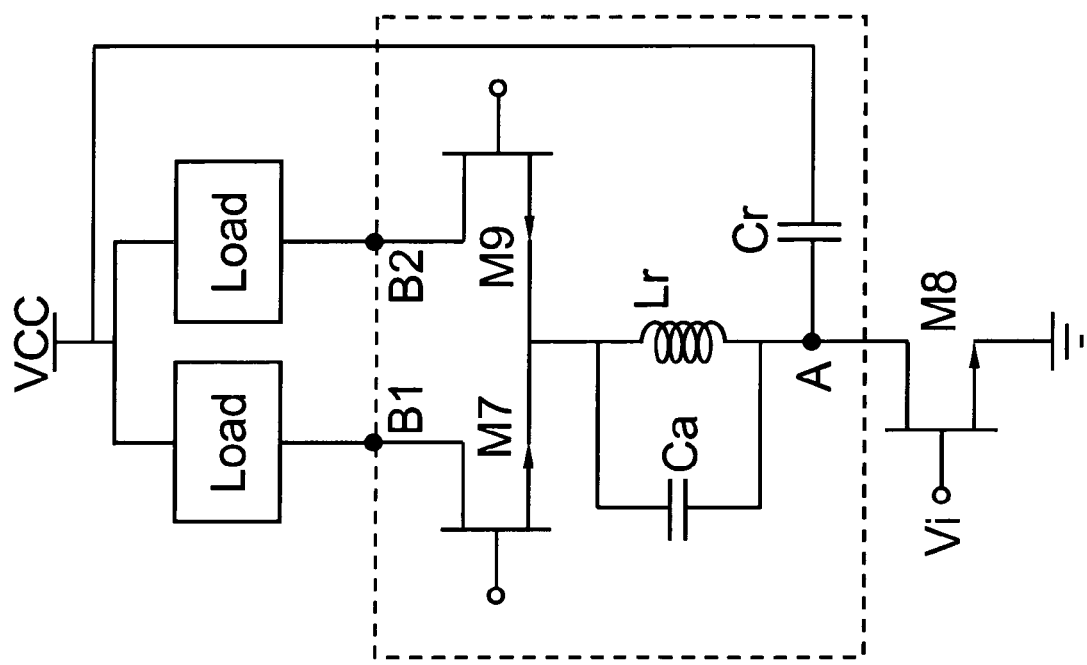
FIG. 14 is the circuit architecture of the resonant amplifier according to the ninth embodiment of the invention.

At this time, a correction capacitor Ca is connected in parallel at both ends of the resonant inductor Lr to enhance the effective inductance, and a high-frequency zero is added to effectively suppress high-frequency sidebands from the input A, as shown in FIGS. 13 and 14.

The common gate transistor can be a complementary metal oxide semiconductor (CMOS) transistor. Though the a common gate transistor is taken as an example, in fact, the common gate transistor can be replaced by a common base transistor in the above-mentioned architectures, for example, a bipolar junction transistor (BJT), wherein the resonant inductor is connected in series between the emitter and the input point of the common base transistor, and the collector of the common base transistor is connected to the output point.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A resonant amplifier, comprising:
    an input point;
    at least one common gate transistor, wherein each common gate transistor has a gate, a source, and a drain;
    a resonant capacitor, connected to the input point;
    a resonant inductor, connected between the input point and the source and between the source and the resonant capacitor, wherein the resonant inductor, the resonant capacitor and the common gate transistor equivalently form into a loop; and
    at least one output point, respectively connected to the drain.

2. The resonant amplifier according to claim 1, wherein the resonant capacitor is connected between the input point and a ground.

3. The resonant amplifier according to claim 1, capacitor is connected between the input point and a voltage source.

4. The resonant amplifier according to claim 1, further comprising: a correction capacitor, connected in parallel with the resonant inductor.

5. The resonant amplifier according to claim 1, wherein the common gate transistor is a complementary metal oxide semiconductor transistor.

6. The resonant amplifier according to claim 1, further comprising: a current source, connected to the input point.

7. The resonant amplifier according to claim 6, wherein the current source is a common source transistor.

8. A resonant amplifier, comprising:
    an input point;
    at least one common base transistor, wherein each common base transistor has a base, an emitter, and a collector;
    a resonant capacitor, connected to the input point;
    a resonant inductor, connected between the input point and the emitter and between the emitter and the resonant capacitor, wherein the resonant inductor, the resonant capacitor and the common base transistor equivalently form into a loop; and
    at least one output point, respectively connected to the collector.

9. The resonant amplifier according to claim 6, wherein the resonant capacitor is connected between the input point and a ground.

10. The resonant amplifier according to claim 8, wherein the resonant capacitor is connected between the input point and a voltage source.

11. The resonant amplifier according to claim 8, further comprising: a correction capacitor, connected in parallel with the resonant inductor.

12. The resonant amplifier according to claim 8, wherein the common gate transistor is a bipolar junction transistor.

13. The resonant amplifier according to claim 8, further comprising: a current source, connected to the input point.

14. The resonant amplifier according to claim 13, wherein the current source is a common source transistor.

* * * * *